(12) United States Patent
Shih et al.

(10) Patent No.: US 9,039,921 B2
(45) Date of Patent: May 26, 2015

(54) FREESTANDING FILMS WITH ELECTRIC FIELD-ENHANCED PIEZOELECTRIC COEFFICIENTS

(75) Inventors: Wei-Heng Shih, Bryn Mawr, PA (US); Hongyu Luo, Lexington, MA (US); Christian Martorano, Marlton, NJ (US); Wan Y. Shih, Bryn Mawr, PA (US)

(73) Assignee: Drexel University, Philadelphia, PA (US)

( * ) Notice: Subject to any disclaimer, the term of this patent is extended or adjusted under 35 U.S.C. 154(b) by 361 days.

(21) Appl. No.: 12/784,173

(22) Filed: May 20, 2010

(65) Prior Publication Data
US 2010/0224818 A1    Sep. 9, 2010

Related U.S. Application Data

(62) Division of application No. 11/392,116, filed on Mar. 29, 2006, now Pat. No. 7,744,773.

(60) Provisional application No. 60/666,036, filed on Mar. 29, 2005.

(51) Int. Cl.
| | |
|---|---|
| *C04B 35/495* | (2006.01) |
| *H01L 41/18* | (2006.01) |
| *H01L 41/187* | (2006.01) |
| *C04B 35/00* | (2006.01) |
| *C04B 35/499* | (2006.01) |
| *C04B 35/626* | (2006.01) |
| *C04B 35/628* | (2006.01) |

(Continued)

(52) U.S. Cl.
CPC ............. *C04B 35/495* (2013.01); *C04B 35/499* (2013.01); *C04B 35/6264* (2013.01); *C04B 35/628* (2013.01); *C04B 35/6281* (2013.01); *C04B 35/62886* (2013.01); *C04B 35/63424* (2013.01); *C04B 2235/3206* (2013.01); *C04B 2235/3251* (2013.01); *C04B 2235/441* (2013.01); *C04B 2235/449* (2013.01); *C04B 2235/6025* (2013.01); *H01L 41/43* (2013.01); *H01L 41/1875* (2013.01)

(58) Field of Classification Search
None
See application file for complete search history.

(56) References Cited

U.S. PATENT DOCUMENTS

| | | |
|---|---|---|
| 5,874,126 A | 2/1999 | Kahn et al. |
| 2003/0068655 A1 | 4/2003 | Bottomley et al. |
| 2003/0235681 A1 | 12/2003 | Sebastian et al. |

(Continued)

OTHER PUBLICATIONS

Advanced Forming: Advances in Tape Casting Technologies, Ceramic Industry (2004).*

(Continued)

*Primary Examiner* — Yoshitoshi Takeuchi
(74) *Attorney, Agent, or Firm* — Mendelsohn, Drucker & Dunleavy, P.C.

(57) ABSTRACT

A method to produce low-temperature sinterable powders which are then subsequently used to fabricate freestanding piezoelectric films with very large electric-field-enhanced piezoelectric response is provided. The $-d_{31}$ coefficient for PMN-PT layers can be as high as 2000 pm/V, larger than that of commercial single crystalline PMN-PT bulk materials, at 10 kV/cm (or 20 V over the 20-micron film thickness). In contrast to single crystals, the polycrystalline freestanding films are easy to fabricate and can be made into any size. The films are also easily miniaturized. The method can be applied to nearly any piezoelectric material.

9 Claims, 4 Drawing Sheets

Field enhancement of piezoelectric coefficient $d_{31}$ in freestanding PMN-PT tape (filled triangles). For comparison, the data for commercial PZT sheet (open circles) and PMN-PT bulk ceramic (open triangles) are also shown. Up (down) triangles indicate the behavior of increasing (decreasing) field showing the hysteresis behavior.

(51) Int. Cl.
  *C04B 35/634* (2006.01)
  *H01L 41/43* (2013.01)

(56) References Cited

U.S. PATENT DOCUMENTS

2004/0265664 A1  12/2004  Badding et al.
2007/0089515 A1  4/2007  Shih

OTHER PUBLICATIONS

Yasuyoshi Saito et al., "Lead-Free Piezoceramics," Nature, 2004, pp. 84-87, vol. 432.
Lee, C. et al. "Self-excited piezoelectric PZT microcantilevers for dynamic SFM—with inherent sensing and actuating capabilities". Sensors and Actuators A72, 1999, pp. 179-188.
Kim, S. et al., "Fabrication and Characterization of Pb(Zr,Ti)O3 Microcantilever for Resonance Sensors". Jpn. J. Appl. Phys. vol. 42, Mar. 2003, pp. 1475-1478.
T. Haccart et al., "Evaluation of Niobium Effects on the Longitudinal Piezoelectric Coefficients of Pb(Zr,Ti)O3 Thin Films," Applied Physics Letters, 2000, pp. 3292-3294, vol. 76, No. 22.
Gun-Tai Park et al., "Measurement of Piezoelectric Coefficients of Lead Zirconate Titanate Thin Films by Strain-Monitoring Pneumatic Loading Method," Applied Physics Letters, 2002, pp. 4606-4608, vol. 80, No. 24.
Seung-Eek Park et al., "Ultrahigh Strain and Piezoelectric Behavior in Relaxor Based Ferroelectric Single Crystals," J. Applied Physics, 1997, pp. 1804-1811, vol. 82, No. 4.
Joe Kelly et al., "Effect of Composition on the Electromechanical Properties of (1-x)Pb(Mg1/3Nb2/3)O3-xPbTiO3 Ceramics," J. American Ceramics Soc., 1997, pp. 957-964, vol. 80, No. 4.
Data of Commercially Available Product, EDO Corporation, 1999, pp. 1-6.
Data of Commercially Available Product, APC International Ltd., pp. 1-2, (2005).
Huiming Gu et al., Single-Calcination Synthesis of Pyrochlore-Free 0.9Pb(Mg1/3Nb2/3)O3-0.1PbTiO3 and Pb(Mg1/3Nb2/3)O3 Ceramics Using a Coating Method, J. American Ceramics Soc., 2003, pp. 217-221, vol. 86, No. 2.
Hongyu Luo et al., "Comparison in the Coating of Mg(OH)2 on Micron-Sized and Nanometer-Sized Nb2O5 Particles," Int. J. Appl. Ceram. Technol., 2004, pp. 146-154, vol. 1, No. 2.
Hongyu Luo et al., "Synthesis of PMN and 65PMN-35PT Ceramics and Films by a New Suspension Method," Ceramic Trans., 2003, pp. 251-260, vol. 136.
Shaoping Li et al., "The Extrinsic Nature of Nonlinear Behavior Observed in Lead Zirconate Titanate Ferroelectric Ceramic," J. Appl. Physics, 1991, pp. 7219-7224, vol. 69, No. 10.
W. Ren et al., "Nonlinear Strain and DC Bias Induced Piezoelectric Behaviour of Electrostrictive Lead Magnesium Niobate-Lead Titanate Ceramics Under High Electric Fields," J. Physics D: Applied Physics, 2002, pp. 1550-1554, vol. 35.
Qing-Ming Wang et al., "Nonlinear Piezoelectric Behavior of Ceramic Bending Mode Actuators Under Strong Electric Fields," J. Applied Physics, 1999, pp. 3352-3360, vol. 86, No. 6.
Volkmar Mueller et al., "Nonlinearity and Scaling Behavior in Donor-Doped Lead Zirconate Titanate Piezoceramic," Applied Physics Letters, 1998, pp. 2692-2694, vol. 72, No. 21.
Wei Ren et al., "Nonlinear Behavior of Piezoelectric Lead Zinc Niobate-Lead Titanate Single Crystals Under AC Electric Fields and DC Bias," Applied Physics Letters, 2003, pp. 5268-5270, vol. 83, No. 25.
Maureen L. Mulvihill et al., "The Role of Processing Variables in the Flux Growth of Lead Zinc Niobate-Lead Titanate Relaxor Ferroelectric Single Crystals," Jpn. J. Applied Phys., 1996, pp. 3984-3990, Part 1, vol. 35, No. 7.
A-Ming Zhu et al., "Thermal Conductivity and Electromechanical Property of Single-Crystal Lead Magnesium Niobate Titanate," Applied Physics Letters, 1999, pp. 3868-3870, vol. 75, No. 24.

\* cited by examiner

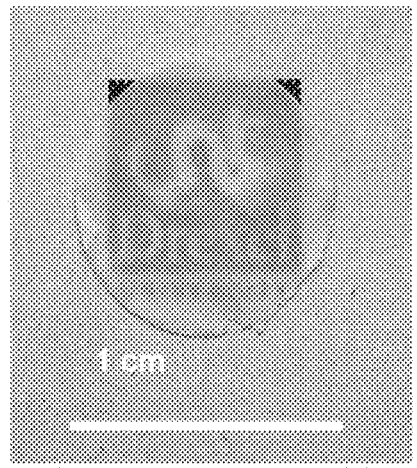
Fig. 1: Photograph of a translucent PMN$_{0.35}$-PT$_{0.35}$ tape 22 ≥m thick and 1 cm in diameter.

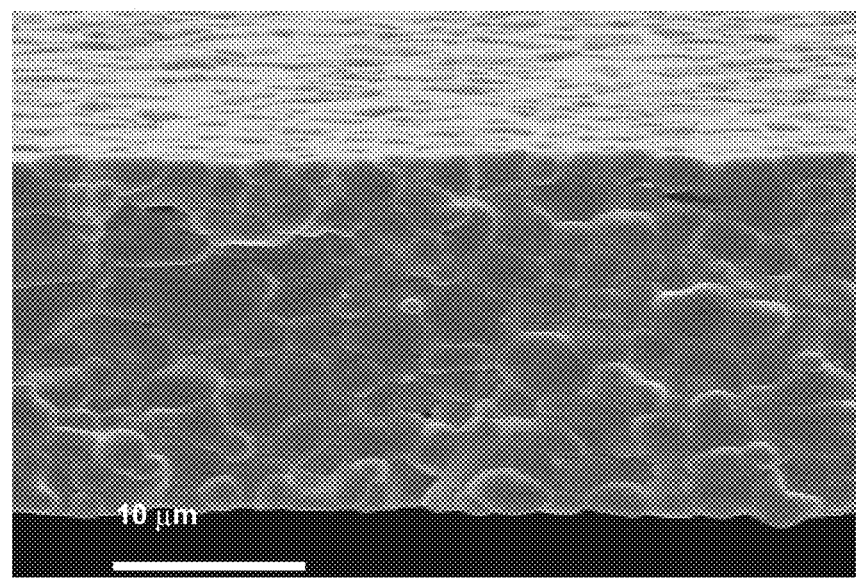
Fig. 2: SEM micrograph of a 22 ≥m thick PMN$_{0.65}$-PT$_{0.35}$ tape.

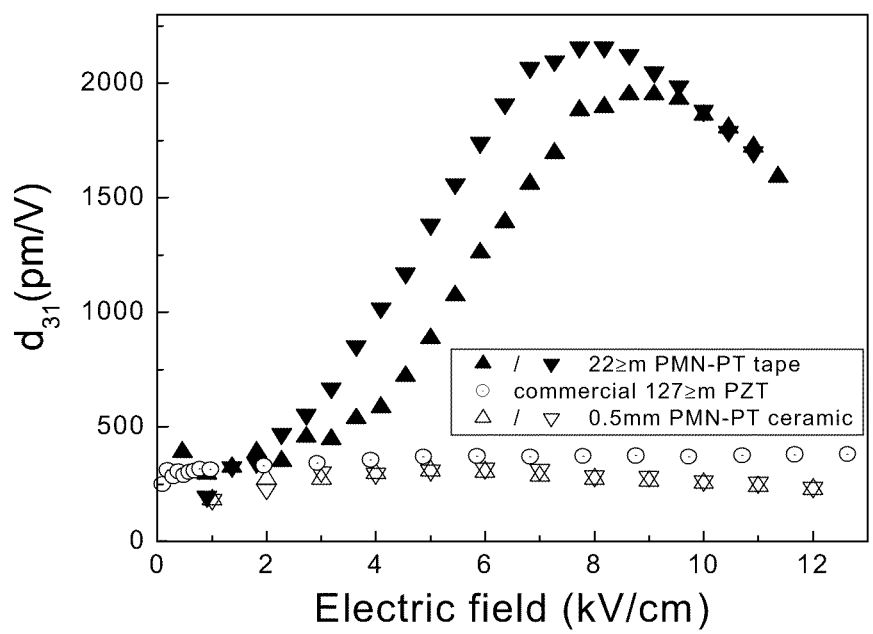
Fig. 3: Field enhancement of piezoelectric coefficient $d_{31}$ in freestanding PMN-PT tape (filled triangles). For comparison, the data for commercial PZT sheet (open circles) and PMN-PT bulk ceramic (open triangles) are also shown. Up (down) triangles indicate the behavior of increasing (decreasing) field showing the hysteresis behavior.

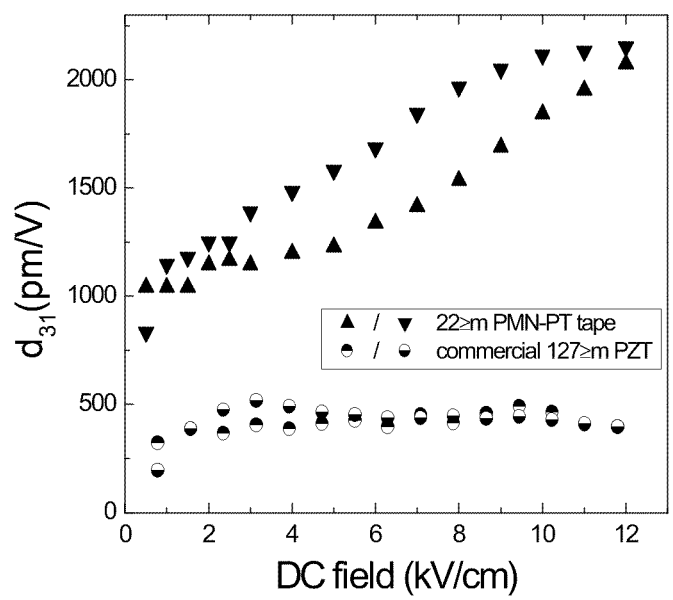
Fig. 4: Piezoelectric coefficient $d_{31}$ in freestanding PMN-PT tape measured by lateral displacement of a PMN-PT rectangular strip under DC fields. The large field enhancement effect is consistent with the results in Fig. 3. Up (down) symbols indicate the behavior of increasing (decreasing) field showing the hysteresis behavior.

FREESTANDING FILMS WITH ELECTRIC FIELD-ENHANCED PIEZOELECTRIC COEFFICIENTS

CROSS-REFERENCE TO RELATED APPLICATIONS

This application is a divisional of U.S. patent application Ser. No. 11/392,116 filed on Mar. 29, 2006, currently pending, which, in turn is a non-provisional of U.S. Provisional patent application No. 60/666,036, filed on Mar. 29, 2005, now expired.

BACKGROUND OF THE INVENTION

1. Field of the Invention

The invention relates to the field of piezoelectric ceramics. In particular the invention relates to polycrystalline ceramics with high piezoelectric coefficients in thin-layer geometry.

2. Description of the Related Technology

Piezoelectric ceramics such as quartz and lead zirconate titanate (PZT) are the primary component in most actuator applications, which command a multi-billion dollar annual market. PZT dominates the current actuator market because of its high piezoelectric coefficients with $d_{33}$ ranging from 100 to 700 and $d_{31}$ ranging from −50 to −300 pm/V. The coefficients $d_{33}$ and $d_{31}$ measure the ratio of the strain parallel and perpendicular to the direction of the electric field, respectively. In general, the magnitude of $d_{33}$ is roughly twice that of $d_{31}$. For comparison, the $-d_{31}$ of quartz is less than 10 pm/V.

However, even with such high piezoelectric coefficients, for a typical 1 mm thick plate, the strains generated by 1000 V are still less than 0.1% in PZT's. The market demand for high-strain actuators has fueled intense research interest in developing piezoelectrics with high piezoelectric coefficients (that is, higher than those of commercial PZT)

For polycrystalline piezoelectric ceramics, including PZT, to be useful, they must be polarized in order to have high piezoelectric coefficients. Before polarization, the orientations of domains are random with no net polarization. After polarization, many domains are aligned or switched to the direction of the applied electric field resulting in a finite polarization. However, the domains in polycrystalline materials are not as easily aligned as in a single crystal.

The piezoelectric behavior of a polarized polycrystalline material under an electric field comes from three effects: the intrinsic piezoelectric effect, the domain wall motion, and the electrostrictive effect. The intrinsic piezoelectric effect is related to the deformation of the lattice structure by the applied electric field. The intrinsic piezoelectric effect is generally small. The electrostrictive deformation is proportional to the square of the applied electric field and is also generally small. The main effect produced by the electric field comes from the domain wall motion. When the domain walls move under an electric field, i.e., domain switching, the net polarization of the sample changes thereby resulting in deformation of the material. Only non-180° domain switching causes dimensional changes, whereas 180° domain switching does not. Domain wall motion is known to be influenced by point defects, grain boundaries, microstructures, and compositions.

Due to the demand for increasingly smaller actuators and devices, much effort has been devoted to developing thin-film-based microactuators and microsensors. Most of the piezoelectric thin films investigated were grown on a silicon-based substrate for integration with the silicon circuitry. However, after more than one decade of development, thin films generally exhibited a smaller piezoelectric coefficient than the bulk material due to substrate pinning that seriously hinders domain-wall motion in the film geometry. For example, bulk lead zirconate titanate (PZT) has a $d_{33}$ of about 500 pm/V, while PZT thin films exhibit a $d_{33}$ of about 100-200 pm/V.[1,2,3] The lower piezoelectric coefficient in thin films is generally attributed to the clamping effect of the substrate.

Recently, a major breakthrough for high-strain piezoelectric ceramics was the development of single crystalline piezoelectric materials. For example, specially cut (001) lead zirconate niobate-lead titanate (PZN-PT) single crystals have a $d_{33}$ of 2500 pm/V.[4] In comparison, PMN-PT bulk ceramics have a $d_{33}$ about 720 pm/V.[5,6] (010)-cut PMN-PT single crystals have a $d_{33}$ greater than 2000 pm/V and a $d_{31}$ of −930 pm/V.[7] PZN-PT single crystal materials have a $d_{33}$ on the order of 2000 pm/V, significantly higher than that of its polycrystalline counterpart. This is because the domains in a single crystal can be more easily aligned due to the transformation from a rhombohedral to a tetragonal structure with application of a sufficiently large electric field.

Even though single crystal piezoelectric materials have high piezoelectric coefficients, they are difficult to process. Specialized growth methods have to be designed and the size of the crystals is limited. Furthermore, only a small fraction of piezoelectric materials can be grown into a single crystal. For example, the most popular piezoelectric, PZT, cannot currently be grown into a single crystal. Due to the scarcity of single crystal piezoelectric materials, their price is very high as well. Furthermore, single crystal materials are macroscopic in size. They are difficult to miniaturize for many MEMS (microelectro-mechanical systems) applications.

Therefore, there exists a need for providing polycrystalline ceramics with high piezoelectric coefficients in thin-layer geometry.

SUMMARY OF THE INVENTION

Accordingly, it is an object of certain embodiments of the invention to provide polycrystalline ceramics with high piezoelectric coefficients in a thin-layer geometry. Other embodiments of the invention provide dielectric/ferroelectric ceramics.

One embodiment of the invention relates to a precursor suspension coating (PSC) method for fabricating low-temperature, sinterable polycrystalline ceramics. In this method, submicron crystalline powder was first obtained by dispersing coated crystalline particles in a solution reactive with the coating followed by calcination. The calcined powder was subsequently suspended in a precursor coating solution to form a precursor powder that could be sintered at a temperature at or below about 900° C. The low sintering temperature may be due to the reactive sintering of the precursor powder during the calcination step.

In another embodiment, the present invention relates to a tape casting method. A mixture of polycrystalline powder, a dispersing resin and a solvent, is prepared. The mixture is mixed to form a slurry. The slurry is then tape cast into polycrystalline layers.

In another embodiment the present invention relates to polycrystalline piezoelectric/dielectric/ferroelectric materials. In another embodiment the present invention relates to polycrystalline piezoelectric/dielectric/ferroelectric materials made by one or more of the methods of the present invention.

These and various other advantages and features of novelty that characterize the invention are pointed out with particularity in the claims annexed hereto and forming a part hereof.

However, for a better understanding of the invention, its advantages, and the objects obtained by its use, reference should be made to the drawings which form a further part hereof, and to the accompanying descriptive matter, in which there is illustrated and described a preferred embodiment of the invention.

BRIEF DESCRIPTION OF THE DRAWINGS

FIG. 1 shows a photograph of a translucent $PMN_{0.35}$-$PT_{0.35}$ tape 22 μm thick and 1 cm in diameter.

FIG. 2 shows a SEM micrograph of a 22 μm thick $PMN_{0.65}$-$PT_{0.35}$ tape.

FIG. 3 shows the field enhancement of piezoelectric coefficient $d_{31}$ in freestanding PMN-PT tape (filled triangles).

FIG. 4 shows the piezoelectric coefficient $d_{31}$ of a freestanding PMN-PT tape measured by lateral displacement of a PMN-PT rectangular strip under DC electric fields.

DETAILED DESCRIPTION OF THE PREFERRED EMBODIMENT(S)

Using a tape casting method, freestanding polycrystalline films of PMN-PT that have a $d_{31}$ of about −2000 pm/V at E=9 kV/cm, higher than that of commercial PMN-PT single crystals, were produced. As a result, use of the tape casting fabrication method has solved the problem of producing piezoelectric ceramics with high piezoelectric coefficients. Freestanding films avoid many problems of thin films on a substrate such as interfacial reactions, thermal expansion coefficient mismatch, substrate pinning/clamping effects, etc.

The highly piezoelectric thin layers have many applications in, for example, sensors, actuators and MEMS. The layers can be stacked to form a multi-layer actuator that can generate large and precise displacements and forces with a relatively small voltage, e.g., <20V. The thin layer geometry allows easy miniaturization by simple wire-saw cutting to produce high energy density, but low-power consumption, MEMS devices. Each of the actuator, sensor, and MEMS areas commands a large market.

In addition, one embodiment of the invention relates to a precursor suspension coating (PSC) method for fabricating low-temperature, sinterable polycrystalline $[Pb(Mg_{1/3}Nb_{2/3})O_3]_{0.63}$-$[PbTiO3]_{0.37}$ (PMN-PT) ceramics. In this method, submicron crystalline PMN powder was first obtained by dispersing $Mg(OH)_2$-coated $Nb_2O_5$ particles in a lead acetate/ethylene glycol solution followed by calcination at about 800° C. The crystalline PMN powder was subsequently suspended in a PT precursor solution containing lead acetate and titanium isopropoxide in ethylene glycol to form the PMN-PT precursor powder that could be sintered at a temperature as low as about 900° C. The combination of using sinterable PMN powders and the elimination of defects created by placement of thin films on substrates, produced superior PMN-PT films.

The low sintering temperature may be due to the reactive sintering of the PMN-PT precursor powder. The reaction between the PT and the PMN occurred in the same temperature range as the densification process, 850-1000° C., thus significantly accelerated the sintering process. The present PSC technique is robust and can be readily applicable to other lead based piezoelectrics and other non-lead-based materials as well, and may be applicable to the use of other suitable coating materials.

Example for Low-Temperature, Sinterable Powders

The synthesis of the reactive PMN-PT precursor powder entailed two precursor suspension coating (PSC) steps. The first PSC step involved suspending $Mg(OH)_2$-coated $Nb_2O_5$ particles in a lead acetate/ethylene glycol solution to obtain the PMN precursor powder. The second PSC step involved suspending the calcined PMN powder in a PT precursor containing lead acetate and titanium isopropoxide solution in ethylene glycol.

Niobium oxide ($Nb_2O_5$, 99.9%, Aldrich Chemical Company, Inc., Milwaukee, Wis.) was ultrasonically dispersed in distilled water after adding ammonium hydroxide (4.96 N solution in water, Aldrich Chemical Company, Inc., Milwaukee, Wis.). Magnesium nitrate solutions were first prepared by dissolving magnesium nitrate hexahydrate ($Mg(NO_3)_2$ $I6H_2O$, 99%, Aldrich Chemical Company, Inc., Milwaukee, Wis.) in distilled water. The magnesium nitrate solution was dropped into the niobium oxide dispersion. Since the pH of the dispersion was between 10 and 11, magnesium hydroxide precipitated and coated on the niobium oxide particles. The final concentration of the $Nb_2O_5$ powder in the coating suspension was 26.6 g/L or 0.1 M.

The $Mg(OH)_2$-coated $Nb_2O_5$ particles were dried subsequently at 150° C. on a hot plate.[8,9] After drying, the $Mg(OH)_2$-coated $Nb_2O_5$ powder was added to a lead precursor solution where lead acetate anhydrous ($Pb(CH_3COO)_2$·$2Pb(OH)_2$, Fluka) was dissolved in ethylene glycol ($HOCH_2CH_2OH$, Alfa Aesar) with 15% excess lead. These procedures complete the first PSC step.

The slurry was dried at 150° C. on a hot plate. Pyrochlore-free perovskite PMN powder was obtained by first heating the PMN precursor powder at 1° C./min to 300° C. for 2 hr followed by 5° C./min to 800° C. for 2 hr.[10]

The perovskite PMN powder was then suspended in a PT precursor solution containing lead acetate and titanium isopropoxide ($Ti(OCH(CH_3)_2)_4$, Alfa Aesar) in ethylene glycol (EG) and ball milled for 24 hr. The final nominal composition was $PMN_{0.63}$-$PT_{0.37}$ with 10% lead excess. The ball milled PMN-PT precursor slurry was then dried at 200° C. on a hot plate for 2 hr and heated at 1° C./min to 300° C. for 2 hr. After drying at 300° C., low-temperature sinterable PMN-PT powder was obtained and in a form ready for tape casting.

Example of Tape Casting

Tape-casting is a forming technique used to produce thin ceramic (and metallic) layers which are formed on a carrier film by the shearing action of a doctor blade on a moving ceramic slurry. The tape contains a binder system, which serves as a carrier for the ceramic powders; i.e., it holds up the ceramic powders so that they will sinter after the binder is burned out. Some of the desirable properties of the binder system include clean decomposition, good solubility in a wide range of solvents and decent green-strength.

Acrylic resins, such as methyl methacrylate and ethyl methacrylate have long been used in binder systems for ceramic tape casting for their low ash residue upon binder burnout. The use of longer chain alcohol (e.g. alcohols having 4-12 carbon atoms in the chain) esters of methacrylic or acrylic acid yielded much lower decomposition profiles and improved electrical properties. For example, iso-butyl methacrylate, having a molecular weight of 60,000 (Rohm & Haas, Paraloid B-38), yields virtually no measurable ash content upon decomposition. This is the result of the use of acrylic acid ester or methacrylic acid ester monomers of 4 carbon atoms or higher, and also includes pentyl acrylate, pentyl methacrylate, hexyl acrylate, hexyl methacrylate, heptyl acrylate, heptyl methacrylate, octyl acrylate, octyl methacrylate, nonyl acrylate, nonyl methacrylate, decyl acrylate, decyl methacrylate, undecyl acrylate, undecyl methacrylate, dodecyl acrylate, and dodecyl methacrylate.

Dispersion of the PMN-PT powders is accomplished by a blend of low (about 1,000-10,000) and mid (about 40,000-80,000) molecular weight dispersing resins. A dispersing resin from Rohm and Haas, Paraloid DM-55, with a molecular weight of 6,000, is a blend of methyl methacrylate, isobornyl methacrylate, and proprietary monomers in amounts of 0.1% by weight to 30% by weight, based upon the weight of the ceramic powders. This is blended with an iso-butyl methacrylate polymer, with a molecular weight of ~60,000 (Paraloid B38 from Rohm and Haas Company) in an amount of 0.1% to 50.0% by weight, based upon weight of the total binder. This dispersion method allows for a higher powder loading, resulting in a denser final part with less shrinkage.

A mill jar was charged with yttria stabilized zirconia media, PMN-PT powder, a dispersing resin blend, and a solvent blend of an alcohol and a ketone; for instance, isopropyl alcohol and methyl ethyl ketone, but could also include various alcohols, ketones, esters, glycol ethers, aliphatic hydrocarbons, and aromatic hydrocarbons. The mill base was ball milled for 16-24 hrs. Then, the balance of the binder/resin was added (1%-50% by weight, based on weight of the ceramic powder), along with a phthalate-based plasticizer (binder: plasticizer ratio of about 2:1 to 3:1); the mixture was then rolled for an additional 24 hrs. The slurry was then de-aerated, and cast into various thicknesses. The green tapes were then punched and prepared for binder removal and sintering.

Examples of Electric-Field Enhanced Freestanding Films

FIG. 1 shows a photograph of a translucent PMN-PT film made by the present process. FIG. 2 shows an SEM image of the cross-section of a PMN-PT film. Clearly, the film is fully dense with a uniform grain size distribution. FIG. 3 shows the piezoelectric coefficient $d_{31}$ of a 22 μm film versus the electric field where the $d_{31}$ was deduced from the displacement of a 2.5 mm long cantilever consisting of a PMN-PT layer bonded to a 5 μm thick copper layer. As can be seen, the $-d_{31}$ coefficient increased to 2000 pm/V at about 9 kV/cm. The present $-d_{31}$ value of 2000 pm/V was much higher than that of commercial PMN-PT single crystals.

To confirm the enhanced $-d_{31}$ coefficient, direct measurement of the lateral elongation of a freestanding film was performed when an electric field was applied perpendicular to the film. The results of the direct measurement are shown in FIG. 4. The direct lateral elongation measurements also showed an enhanced $-d_{31}$ of 2000 pm/V at around 10 kV/cm, consistent with the data shown in FIG. 3 indicating that the enhanced $d_{31}$ coefficient is an intrinsic effect of the freestanding film and not an effect of the bi-layer structure used in the cantilever displacement measurement described above.

Thus, in another aspect, the present invention relates to polycrystalline ceramics having a $-d_{31}$ of at least 1500 pm/V at around 10 kV/cm, more preferably a $-d_{31}$ of at least 1800 pm/V at around 10 kV/cm, and, most preferably, a $-d_{31}$ of at least 2000 pm/V at around 10 kV/cm.

Nonlinear piezoelectric responses of piezoelectric materials have been observed in several studies. For example, in soft PZT bulk ceramics, $-d_{31}$ was observed to increase about 50% from 170 pm/V at low fields (<0.1 kV/cm) to about 230 pm/V at higher fields (~1 kV/cm).[11,12] However, $-d_{31}$ values at even higher fields (5~20 kV/cm) were not available because such high fields were limited by the high voltages needed across the thickness (~0.5 mm).

In another example, a series of commercial soft PZT ceramics showed field enhancement increases of $d_{33}$ from 400 pm/V at below 0.1 kV/cm to 1600 pm/V at 6 kV/cm.[13] For relaxor PMN-PT bulk ceramics, it was reported that field enhancement increases of $d_{33}$ from 100 pm/V to 1200 pm/V were achieved when the field was increased to 5 kV/cm, above which $d_{33}$ quickly degenerated.[14]

In PZN-PT single crystals, however, field enhancement increases of $d_{33}$ from 2000 pm/V to 5000 pm/V with linear-nonlinear threshold at 2~4 kV/cm were achieved,[15] which is comparable to that of the freestanding PMN-PT tapes (3~5 kV/cm).

The disadvantages of PZN-PT or PMN-PT single crystals are the difficulties in processing and machining. One of the approaches is to produce single crystals by the flux method[16] where the ingredient powders are dry mixed and then loaded into a platinum crucible and held at the soaking temperatures ~1100-1200° C., followed by slow cooling ~1-5° C./h. About two thirds (⅔) of the initial mixture are excess lead which is needed to generate a liquid phase (flux) and to counter the effect of lead evaporation at the high soaking temperature. The crystals obtained are rather small (3 to 20 mm), and they need to be recovered by hot $HNO_3$ to separate the crystals out of the rest of the melt. Also, the crystal growing process is slow (>100 hours).

A vertical Bridgmen-Stockbarger method is another approach to make PMN-PT single crystals.[17] The starting materials are high purity PbO, MgO, $Nb_2O_5$ and $TiO_2$. After mixing, they are loaded into a platinum crucible and heated to a maximum temperature of 1395° C. with a gradient in the crystal growing direction. With a seed crystal, the growth rate was controlled at 0.4~0.8 mm/hr at a temperature gradient of 20° C./cm. Typical crystal size is about 1 cm. Although stoichiometric ingredients were used, the temperature was much higher than that of the flux method. The crucible must be tightly sealed to prevent lead evaporation.

One advantage of the process of the present invention is that the defects associated with a substrate that may prevent domain wall motion are eliminated by the freestanding layer geometry. The high piezoelectric coefficient is found in bulk samples under the same electric fields. The electric-field enhancement effect on the piezoelectric coefficient only occurs in the freestanding thin layer geometry. Conceivably, the thin layer, which has only a few grains across the thickness, allows the applied electric field to penetrate through the sample more easily, thus permitting the domain wall motion to be activated in a more complete manner.

Various embodiments of the present invention may offer one or more of the following advantages:
1. One embodiment of the present invention provides a precursor suspension coating (PSC) method to produce reactive powders with sintering temperatures lower than 1000° C.
2. Another embodiment of the invention provides a tape casting method with minimal burnout product which can be used to produce freestanding films using the low-temperature sinterable powders.
3. The method of the present invention is applicable to most piezoelectric/dielectric/ferroelectric ceramics including solid-solution perovskites such as PMN-PT, PZT, and lead-free piezoelectrics/dielectrics/ferroelectrics.
4. The method of the present invention applies to PMN-PT powders made from $Mg(OH)_2$-coated $Nb_2O_5$ powders.
5. The method of the present invention applies to PZT powders made from $ZrO_2$-coated $TiO_2$ powders.
6. The PMN powders produced from $Mg(OH)_2$-coated $Nb_2O_5$ powders coated with the PT precursor can be sintered at temperatures below 900° C., and as low as 850° C.
7. The freestanding layers have a very large electric-field enhanced piezoelectric coefficient for a layer thickness of <50 μm.
8. The binder system may be an acrylic acid ester or methacrylic acid ester of 4 carbons or higher.

9. The dispersant may be a blend of low and mid molecular weight dispersing resins.

It is to be understood, however, that even though numerous characteristics and advantages of the present invention have been set forth in the foregoing description, together with details of the structure and function of the invention, the disclosure is illustrative only, and changes may be made in detail, especially in matters of shape, size and arrangement of parts within the principles of the invention to the full extent indicated by the broad general meaning of the terms in which the appended claims are expressed.

REFERENCES

[1] Y. Saito, H. Takao, T. Tani, T. Nonoyama, K. Takatori, T. Homma, T. Nagaya and M. Nakamura, "Lead-Free Piezoceramics", *Nature*, 432, 84-87 (2004)

[2] T. Haccart, E. Cattan, D. Remiens, S. Hiboux and P. Muralt, "Evaluation of Niobium Effects on the Longitudinal Piezoelectric Coefficients of Pb(Zr,Ti)O$_3$ Thin Films", *Appl. Phys. Lett.*, 76(22), 3292-3294 (2000)

[3] G.-T. Park, J.-J. Choi, J. Ryu, H. Fan, and H.-E. Kim, "Measurement of Piezoelectric Coefficients of Lead Zirconate Titanate Thin Films by Strain-Monitoring Pneumatic Loading Method", *Appl. Phys. Lett.*, 80(24), 4606-4608 (2002)

[4] S.-E. Park and T. R. Shrout, "Ultrahigh Strain and Piezoelectric Behavior in Relaxor Based Ferroelectric Single Crystals", *J. Appl. Phys.*, 82(4), 1804~1811 (1997)

[5] J. Kelly, M. Leonard, C. Tantigate, and A. Safari, "Effect of Composition on the Electromechanical Properties of (1-x)Pb(Mg$_{1/3}$Nb$_{2/3}$)O$_3$-xPbTiO$_3$ Ceramics", *J. Am. Ceram. Soc.*, 80[4] 957-64 (1997)

[6] Data of commercially available product, EDO Corporation

[7] Data of commercially available product, APC International, Ltd.

[8] H. Gu, W. Y. Shih., W.-H. Shih, "Single-Calcination Synthesis of Pyrochlore-Free 0.9PMN-0.1PT and PMN Ceramics by a Coating Method," *J. Am. Ceram. Soc.*, 86(2): p. 217 (2003)

[9] H. Luo, W. Y. Shih, and W.-H. Shih, "Comparison in the Coating of Mg(OH)$_2$ on Micron-sized and Nano-sized Nb$_2$O$_5$ Particles," *International J. Appl. Ceram. Tech.*, 1(2): 146-154 (2004)

[10] H. Luo, W. Y. Shih., and W.-H. Shih, "Synthesis of PMN and 65PMN-35PT Ceramics and Films by a New Suspension Method," *Ceram. Trans.*, 136: p. 251-260 (2003)

[11] S. Li, W. Cao, and L. E. Cross, "The Extrinsic Nature of Nonlinear Behavior Observed in Lead Zirconate Titanate Ferroelectric Ceramic", *J. Appl. Phys.*, 69(10), 7219-7224 (1991)

[12] Q.-M. Wang, Q. Zhang, B. Xu, R. Liu, and L. Eric Cross, "Nonlinear Piezoelectric Behavior of Ceramic Bending Mode Actuators under Strong Electric Fields", J. Appl. Phys., 86(6), 3352-3360 (1999)

[13] V. Mueller and Q. M. Zhang, "Nonlinearity and Scaling Behavior in Donor-Doped Lead Zirconate Titanate Piezoceramic", *Appl. Phys. Lett.*, 72(21), 2692-2694 (1998)

[14] W. Ren, A. J. Masys, G. Yang and B. K. Mukherjee, "Nonlinear Strain and DC Bias Induced Piezoelectric Behavior of Electrostrictive Lead Magnesium Niobate-Lead Titanate Ceramics under High Electric Fields", *J. Phys. D: Appl. Phys.*, 35, 1550-1554 (2002)

[15] W. Ren, S.-F. Liu, and B. K. Mukherjee, "Nonlinear Behavior of Piezoelectric Lead Zinc Niobate-Lead Titanate Single Crystals under AC Electric Fields and DC Bias", *J. Appl. Phys.*, 83(25), 5268-5270 (2003)

[16] M. L. Mulvihill, S.-E. Park, G. Risch, Z. Li, K. Uchino, and T. R. Shrout, "The Role of Processing Variables in the Flux Growth of Lead Zinc Niobate-Lead Titanate Relaxor Ferroelectric Single Crystals", *Jpn. J. Appl. Phys.*, Part 1, 35(7), 3984-3990 (1996)

[17] D.-M. Zhu, and P. D. Han, "Thermal Conductivity and Electromechanical Property of Single-Crystal Lead Magnesium Niobate Titanate", *Appl. Phys. Lett.*, 75(24), 3868-3870 (1999)

What is claimed is:

1. A polycrystalline ceramic freestanding film having –d31 of from 1500 pm/V to 2000 pm/V at either 9 or 10 kV/cm, wherein the film has a thickness of a few grains up to 50 μm and said polycrystalline ceramic is either PMN-PT or PZN-PT.

2. A polycrystalline ceramic freestanding film as claimed in claim 1, having a –d31 of at least 1800 pm/V at either 9 or 10 kV/cm.

3. A polycrystalline ceramic freestanding film as claimed in claim 1, wherein the polycrystalline ceramic freestanding film is formed by reactive sintering of a calcined product which comprises lead magnesium niobate and a material reactive with the calcined product which comprises lead titanate.

4. A device selected from the group consisting of sensors, actuators and microelectro-mechanical systems made using the polycrystalline freestanding film as claimed in claim 1.

5. A device as claimed in claim 4, wherein the device is a microelectro-mechanical system.

6. A polycrystalline ceramic freestanding film having –d31 of from 1500 pm/V to 2000 pm/V at either 9 or 10 kV/cm, wherein the film has a thickness of from 22 um to 50 μm and said polycrystalline ceramic is either PMN-PT or PZN-PT.

7. A polycrystalline ceramic freestanding film as claimed in claim 6, having a –d31 of at least 1800 pm/V at either 9 or 10 kV/cm.

8. A device selected from the group consisting of sensors, actuators and microelectro-mechanical systems made using the polycrystalline freestanding film as claimed in claim 6.

9. A device as claimed in claim 8, wherein the device is a microelectro-mechanical system.

* * * * *